United States Patent [19]
Lee et al.

[11] Patent Number: 6,029,740
[45] Date of Patent: Feb. 29, 2000

[54] PROTECTIVE CAP FOR HEAT CONDUCTING MEDIUM

[75] Inventors: Shun-Jung Lee, Pan-Chiao; Hsieh-Kun Lee, Chung-Ho, both of Taiwan

[73] Assignee: Hon Hai Precision Ind. Co., Ltd., Taipei Hsien, Taiwan

[21] Appl. No.: 09/217,679

[22] Filed: Dec. 21, 1998

[30] Foreign Application Priority Data

Dec. 19, 1997 [TW] Taiwan .................................. 86221218

[51] Int. Cl.7 .................................................. H05K 7/20
[52] U.S. Cl. ............................ 165/76; 165/185; 361/704; 361/705
[58] Field of Search ........................... 165/76, 80.3, 185; 361/704, 705, 708, 709; 257/719, 722

[56] References Cited

U.S. PATENT DOCUMENTS

| | | | |
|---|---|---|---|
| 5,528,077 | 6/1996 | Tane et al. | 257/666 |
| 5,561,590 | 10/1996 | Norell et al. | 361/699 |
| 5,708,564 | 1/1998 | Lin | 361/704 |
| 5,897,917 | 4/1999 | Hinshaw et al. | 422/258 |

*Primary Examiner*—Allen Flanigan

[57] ABSTRACT

A protective cap comprises a cap portion and a mounting bracket attached to the cap portion along its peripheral walls. The mounting bracket includes upper and lower bars connected to opposite peripheral walls of the cap portion. A mounting seat is defined by the vertical beam and portions of the upper and lower bars. An attaching tab is seated within the mounting seat for attaching the protective cap to an under face of a heat sink. A tab extends outward from one of the upper and lower bars serving as a handle.

6 Claims, 4 Drawing Sheets

PROTECTIVE CAP FOR HEAT CONDUCTING MEDIUM

FIELD OF THE INVENTION

The present invention relates to a protective cap, and more particularly to a protective cap for use with a heat dissipating device on which a heat conductive medium is coated.

DESCRIPTION OF PRIOR ART

Effective heat dissipation is essential to proper operation of a computer system since the computer system may experience a malfunction when a CPU is overheated. In order to ensure proper operation of the CPU device, a heat sink having an array of cooling fins is securely attached to an upper face of the CPU to dissipate heat generated thereby. The heat generated by the CPU is transferred to the cooling fins of the heat sink and then dissipates into the ambient air. By this arrangement, the temperature of the CPU is maintained within an acceptable limit. U.S. Pat. Nos. 5,019,940, 5,276,585, 5,436,798, 5,486,981, 5,590,025 and 5,594,624 disclose such heat sinks.

An air gap exists between the upper face of the CPU and a bottom face of the heat sink, the heat resistance of the air gap hinders heat transfer between those two faces. In order to overcome this problem, a heat conductive medium is disposed between the heat sink and the CPU. As shown in FIG. 1, a heat conductive medium 20 is disposed between the CPU 10 and the heat sink 30 to eliminate the air gap therebetween. The heat conductive medium 20 can either be a thermal tape or thermal grease. However, these heat conductive media have the following defects.

For double-side-coating tape, a cover of the tape is peeled off and attached to a bottom of a heat sink. The heat sink is then attached to an upper face of a CPU. For single-side coating tape, the tape is directly attached to an upper face of a CPU, then the heat sink is directly attached thereto. Thermal tape efficiently eliminates the air gap between the heat sink and the CPU, however, the thermal tape has a high heat resistance which hinders the heat transfer between the CPU and the heat sink. Furthermore, if the thermal tape is not smoothly deployed onto the corresponding surfaces, the heat transfer may be further hindered.

Thermal grease can be readily deployed on an under face of the heat sink before attaching the heat sink to the upper face of the CPU. Thermal grease has excellent thermal conductivity because of its low heat resistance. Nevertheless, thermal grease is sticky at room temperature and dust or foreign debris may become trapped therein. In light of this, thermal grease can not be deployed onto the heat sink over an extended period because the sticky grease may soil other devices and adversely affect the operation thereof. Accordingly, thermal grease can only be deployed immediately prior to the assembly of the heat sink to the CPU. Even though it has excellent heat conductivity, its application is hindered due to its sticky property.

A suggestion for addressing this problem is to use tape to attach a protective cap over thermal grease. This reduces the negative effect of the sticky property of thermal grease. However, once the protective cap is removed, the sticky residue from the tape result in an uneven coating over the face of the heat sink and the heat transfer will be hindered.

SUMMARY OF THE INVENTION

An objective of this invention is to provide a protective cap for use with a heat conductive medium deployed over a face of a heat sink whereby the protective cap can be readily removed from the heat sink without leaving a sticky residue on the face to which the protective cap is assembled.

In order to achieve the objective set forth, a protective cap in accordance with the present invention comprises a cap portion and a mounting bracket attached to the cap portion along its peripheral walls. The mounting bracket includes upper and lower bars connected to opposite peripheral walls of the cap portion. A mounting seat is defined by the vertical beam and portions of the upper and lower bars. An attaching tab is seated within the mounting seat for attaching the protective cap to an under face of a heat sink. A tab extends outward from one of the upper and lower bars serving as a handle.

These and additional objectives, features, and advantages of the present invention will become apparent after reading the following detailed description of the preferred embodiments of the invention taken in conjunction with the appended drawing figures.

DETAILED DESCRIPTION OF PREFERRED EMBODIMENT

Figure 1:
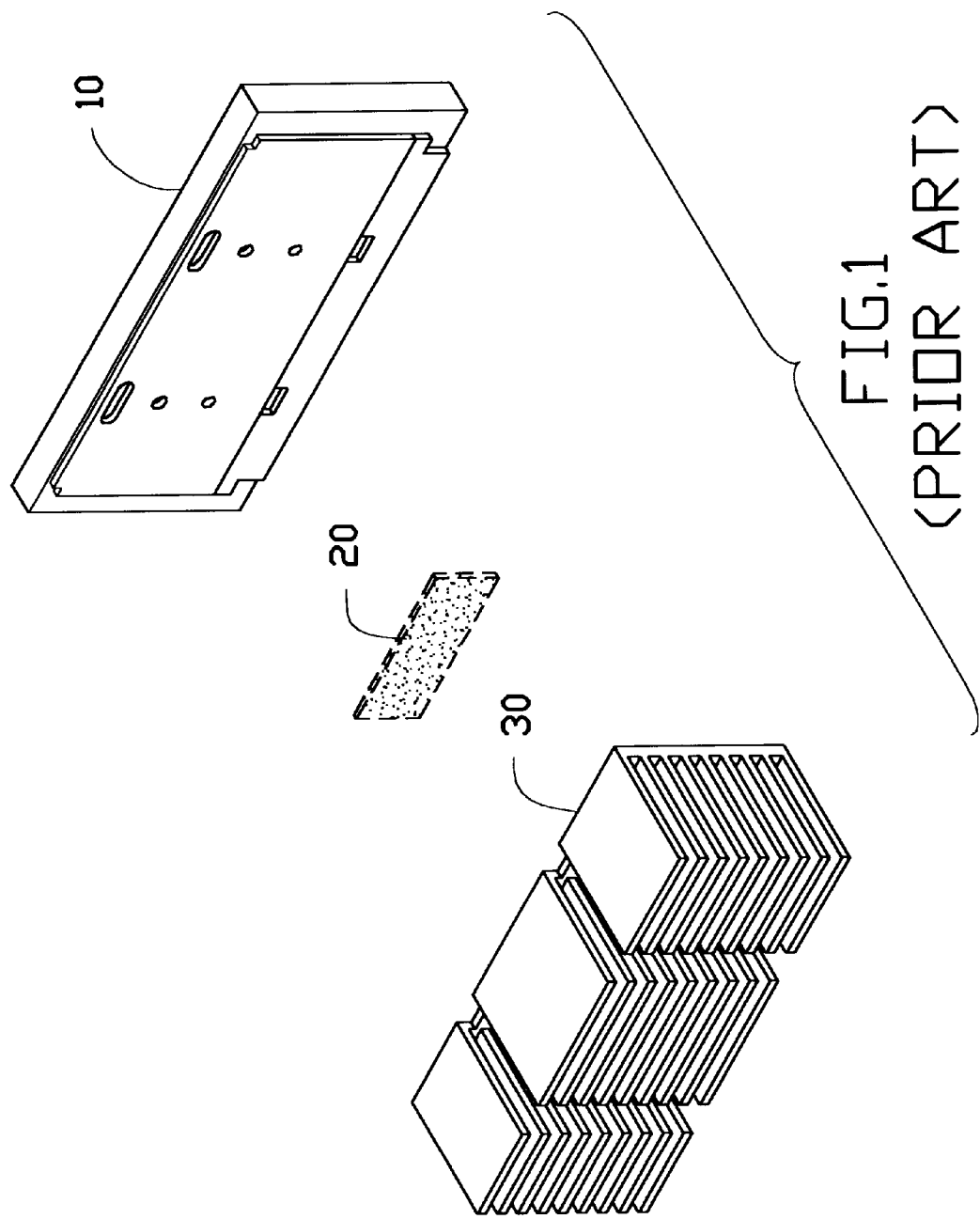
FIG. 1 is an exploded view of a conventional assembly of a heat sink, a heat conductive medium, and a CPU module.
Figure 2:
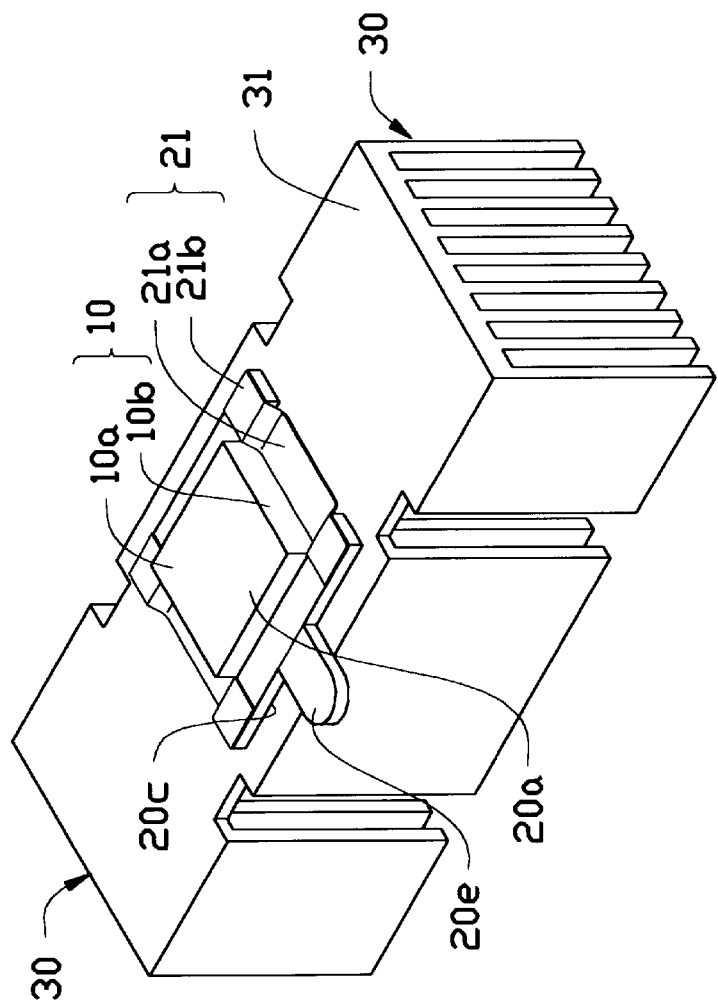
FIG. 2 is a perspective view of a heat sink having a protective cap in accordance with the present invention attached thereto.
Figure 3:
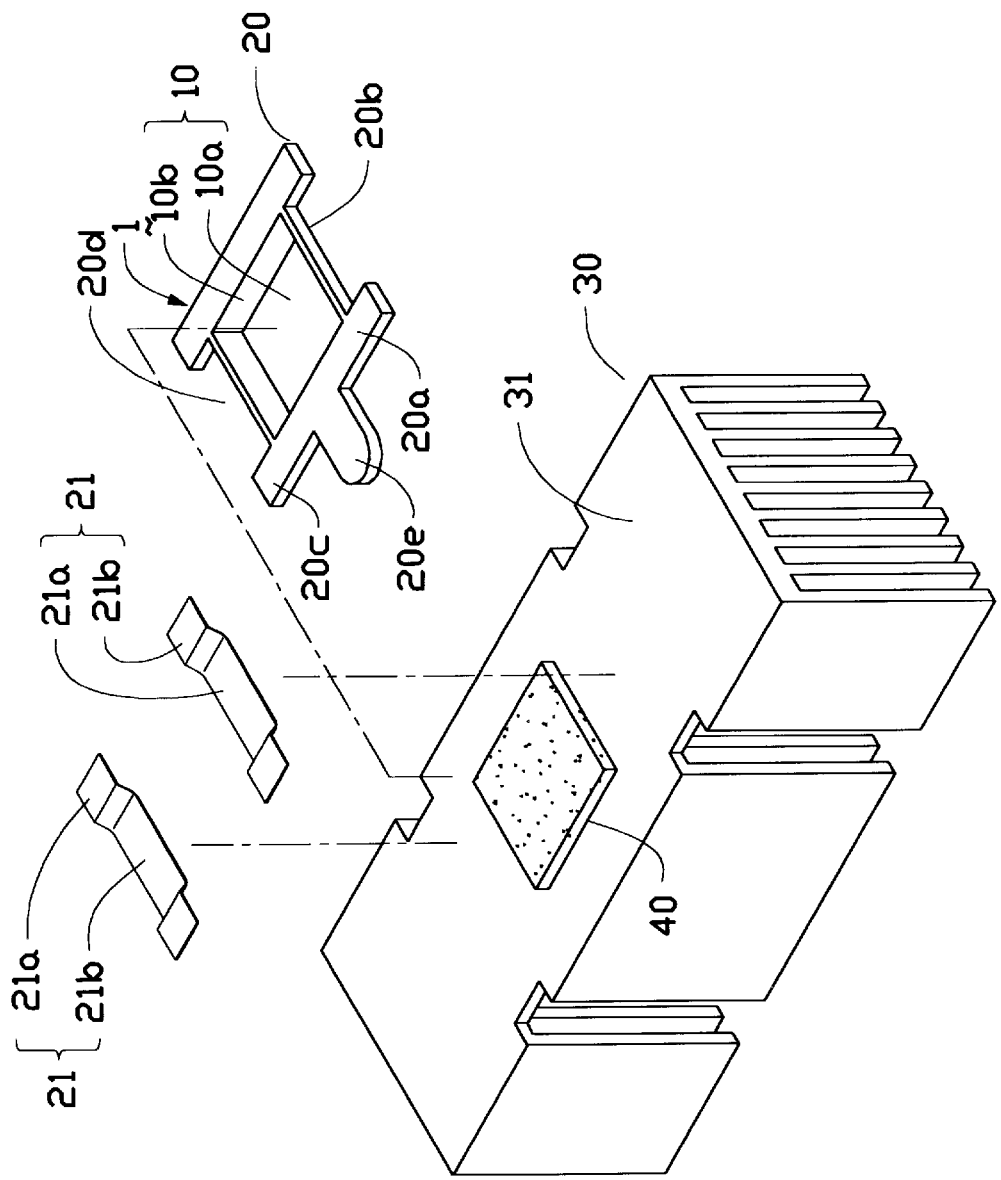
FIG. 3 is an exploded view of FIG. 2 showing a layer of thermal grease deployed on the heat sink.

Referring to FIGS. 2 and 3, a protective cap 1 in accordance with a first embodiment of the present invention can be readily attached to an under face 31 of a heat sink 30 in a manner that a layer of thermal grease 40 deployed on the under face 31 is covered under the cap 1. The protective cap 1 comprises a cap portion 10 forming a ceiling 10a and a peripheral wall 10b, and a mounting bracket 20 forming a pair of traverse bars 20a and a pair of vertical beams 20b bridging the traverse bars 20a. mounting bracket 20 defines an opening (not labeled) for connecting with the peripheral wall 10b of the cap portion 10. The traverse bar 20a forms a flange portion 20c extending from both ends thereof and defines a mounting seat 20d therebetween. The traverse bar 20a further forms integrally a tab 20e serving as a handle of the protective cap 1 for facilitating easy removal from the heat sink 30. Attaching tape 21 is seated within the mounting seat 20d for attaching the protective cap 10 to the heat sink 30. Each attaching tape 21 includes a connecting portion 21a for adhering to the under face 31 of the heat sink 30 and an anchoring portion 21b for adhering to the flange portion 20c of the mounting bracket 20.

Thermal grease 40 is deployed onto the under face 31 of the heat sink 30 by means of a printing process. The attaching tape 21 is seated onto the mounting seat 20d whereby the connecting portion 21a protrudes slightly from the mounting seat 20d and the mounting portion 21b is fixedly attached to the flange portion 20c. Then the protective cap 1 can be conveniently positioned above thermal grease 40 by adhering the attaching tape 21 to the under face 31 of the heat sink 30. Since thermal grease 40 is completely covered by the protective cap 1, the sticky property of thermal grease 40 will not affect other devices during the assembly of the heat sink 30.

During assembly of the heat sink 30 to an upper face of a CPU (not shown), the protective cap 1 can be readily removed therefrom by tearing off the tab 20e while the attaching tape 21 will not leave any residue to the under face 31 of the heat sink 30 thereby ensuring smooth contact between the under face 31 of the heat sink 30 and the upper face of the CPU.

Figure 4:
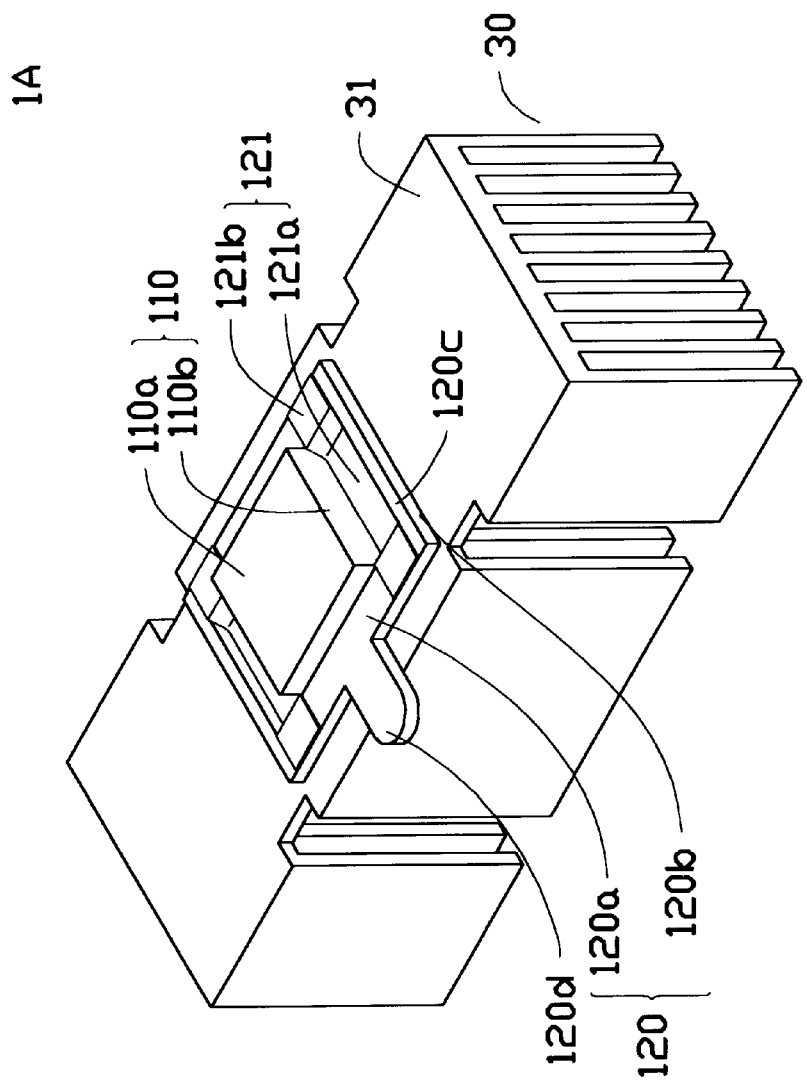
FIG. 4 is an assembled view a heat sink having a protective cap in accordance with a second embodiment of the present invention.

In FIG. 4, a protective cap 1A in accordance with a second embodiment of the present invention comprises a cap portion 110 and a mounting bracket 120 for supporting the cap portion 110. The protective cap 1A has the same configuration as the protective cap 1 of the first embodiment except that the cap portion 110 includes a ceiling 110a and peripheral walls 110b extending therefrom. The mounting bracket 120 defines an opening (not labeled) for receiving the cap portion 110 therein. The mounting bracket 120 includes a pair of traverse bars 120a and a pair of vertical beams 120b between ends of the traverse bars 120a. An elongate slot 120c is defined between each traverse beam 120b and the peripheral wall 110b of the cap portion 110. An attaching tape 121, including a connecting portion 121a and an anchoring portion 121b, is seated within the elongate slot 120c. The mounting bracket 120 further forms a tab 120d on one of the traverse bars 120a serving as a handle. By the provision of the protective cap 1A in accordance with the second embodiment, thermal grease (not shown) is conveniently covered and protected and its sticky property will not affect other devices during the assembly.

While the present invention has been described with reference to specific embodiments, the description is illustrative of the invention and is not to be construed as limiting the invention. Various modifications to the present invention can be made to the preferred embodiment by those skilled in the art without departing from the true spirit and scope of the invention as defined by the appended claims.

We claim:

1. A protective cap for use with a layer of thermal grease, comprising a cap portion forming a ceiling and peripheral walls extending from said ceiling; and a mounting bracket forming at least a pair of traverse bars attached opposite peripheral walls of said cap portion, a mounting seat being defined between said peripheral wall of said cap portion and portions of said traverse bars; and attaching tapes each forming a connecting portion and an anchoring portion, being disposed within each said mounting seat, wherein said anchoring portion is attached to said portions of said traverse bars and said connecting portion protrudes slightly over said mounting seat.

2. The protective cap as recited in claim 1, wherein a tab is integrally formed on one of said traverse bars serving as a handle.

3. The protective cap as recited in claim 1, wherein said mounting bracket further includes a pair of vertical beams bridging between said traverse bars.

4. The protective cap as recited in claim 3, wherein a mounting seat is defined between said vertical beam, a portion of said traverse bar, and the peripheral wall of said cap portion.

5. An assembly including:

a heat sink defining a first surface;

a layer of thermal grease applied unto said surface;

a cap portion forming a ceiling and peripheral walls extending from said ceiling;

a mounting bracket integrally formed with and beside the cap portion; and means for securing the cap portion to the heat sink, said means including a connecting portion attached unto the surface of the heat sink and an anchoring portion attached to the mounting bracket whereby the layer is covered by the cap portion.

6. The assembly as recited in claim 5, wherein said means is an attaching tape.

\* \* \* \* \*